United States Patent
Kasai et al.

(10) Patent No.: US 9,663,856 B2
(45) Date of Patent: May 30, 2017

(54) PLASMA PROCESSING APPARATUS AND SHOWER PLATE

(71) Applicant: Tokyo Electron Limited, Tokyo (JP)

(72) Inventors: Shigeru Kasai, Nirasaki (JP); Taro Ikeda, Nirasaki (JP); Yutaka Fujino, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 406 days.

(21) Appl. No.: 14/219,360

(22) Filed: Mar. 19, 2014

(65) Prior Publication Data

US 2014/0283747 A1    Sep. 25, 2014

(30) Foreign Application Priority Data

Mar. 21, 2013    (JP) .................. 2013-058663

(51) Int. Cl.
| | |
|---|---|
| C23C 16/44 | (2006.01) |
| B05B 1/00 | (2006.01) |
| C23C 16/452 | (2006.01) |
| H01J 37/32 | (2006.01) |
| B05B 1/14 | (2006.01) |

(52) U.S. Cl.
CPC .......... *C23C 16/4401* (2013.01); *B05B 1/005* (2013.01); *C23C 16/452* (2013.01); *H01J 37/3244* (2013.01); *H01J 37/32192* (2013.01); *H01J 37/32293* (2013.01); *B05B 1/14* (2013.01)

(58) Field of Classification Search
CPC ............... C23C 16/4401; C23C 16/452; H01J 37/32293; H01J 37/3244; H01J 37/32192; B05B 1/005; B05B 1/14

USPC .............................. 118/723 MW; 156/345.41
See application file for complete search history.

(56) References Cited

U.S. PATENT DOCUMENTS

| | | | |
|---|---|---|---|
| 2002/0002948 A1* | 1/2002 | Hongo | ............... C23C 16/4408 118/723 R |
| 2007/0163996 A1* | 7/2007 | Horiguchi | ........... H01J 37/3244 216/67 |
| 2007/0181531 A1* | 8/2007 | Horiguchi | ............... C23C 16/24 216/67 |
| 2007/0221623 A1* | 9/2007 | Horiguchi | ......... C23C 16/45572 216/69 |

(Continued)

FOREIGN PATENT DOCUMENTS

| | | |
|---|---|---|
| JP | 2003-188103 A | 7/2003 |
| JP | 2005-196994 A | 7/2005 |

(Continued)

*Primary Examiner* — Rudy Zervigon
(74) *Attorney, Agent, or Firm* — Pearne & Gordon LLP

(57) ABSTRACT

A plasma processing apparatus including a processing vessel 10 in which a plasma process is performed and a plasma generation antenna 20 having a shower plate 100 which supplies a first gas and a second gas into the processing vessel 10, performs the plasma process on a substrate with plasma generated by a surface wave formed on a surface of the shower plate 100 through a supply of a microwave. The shower plate 100 has multiple gas holes 133 configured to supply the first gas into the processing vessel 10 and multiple supply nozzles 160 configured to supply the second gas into the processing vessel 10, and the supply nozzles 160 are protruded vertically downwards from a bottom surface of the shower plate 100 and are provided at different positions from the gas holes 133.

8 Claims, 7 Drawing Sheets

(56) References Cited

U.S. PATENT DOCUMENTS

| | | | | |
|---|---|---|---|---|
| 2008/0115728 A1* | 5/2008 | Matsuda | ........... | H01J 37/32009 118/723 R |
| 2010/0075066 A1* | 3/2010 | Ueda | ................... | C23C 16/402 427/575 |
| 2013/0084706 A1* | 4/2013 | Zhao | .................. | H01J 37/3222 438/710 |
| 2014/0283747 A1* | 9/2014 | Kasai | ................. | C23C 16/4401 118/723 R |

FOREIGN PATENT DOCUMENTS

| | | |
|---|---|---|
| JP | 2007-208208 A | 8/2007 |
| JP | 2008-091489 A | 4/2008 |
| JP | 2009-194173 A | 8/2009 |
| KR | 10-2008-0030511 A | 4/2008 |
| KR | 10-0847963 B1 | 7/2008 |
| KR | 10-0861826 B1 | 9/2008 |

* cited by examiner ents described herein pertain generally to a plasma processing apparatus and a shower plate provided in the plasma processing apparatus; and, more particularly, to a structure of a shower plate and a plasma processing apparatus using the same.

PLASMA PROCESSING APPARATUS AND SHOWER PLATE

CROSS-REFERENCE TO RELATED APPLICATION

This application claims the benefit of Japanese Patent Application No. 2013-058663 filed on Mar. 21, 2013, the entire disclosures of which are incorporated herein by reference.

TECHNICAL FIELD

The embodiments described herein pertain generally to a plasma processing apparatus and a shower plate provided in the plasma processing apparatus; and, more particularly, to a structure of a shower plate and a plasma processing apparatus using the same.

BACKGROUND

A plasma process is essentially performed in manufacturing a semiconductor device. Recently, to meet the requirement for high integration and high speed of LSI (Large Scale Integration), there has been a demand for a more improved microfabrication technique in a semiconductor device forming the LSI.

However, in a capacitively coupled plasma processing apparatus or an inductively coupled plasma processing, generated plasma has a high electron temperature and a region having a high plasma density is limited. Thus, it has been difficult to perform a plasma process that satisfies the requirement for improved microfabrication of the semiconductor device.

In order to achieve such improved microfabrication, it is required to generate plasma having a low electron temperature and a high plasma density. To this end, there has been proposed an apparatus configured to generate surface wave plasma in a processing vessel by a microwave and perform a plasma process on a semiconductor wafer by the surface wave plasma (see, for example, Patent Document 1).

In a plasma processing apparatus described in Patent Document 1, a microwave is transmitted through a coaxial waveguide and radiated into a processing vessel, and by exciting a gas through electric field energy of a surface wave of the microwave, surface wave plasma having a low electron temperature and a high plasma density is generated.

In the plasma processing apparatus of Patent Document 1, however, in order to radiate the microwave into the processing vessel from the coaxial waveguide, a ceiling portion of the plasma processing apparatus has a structure in which a dielectric plate made of, e.g., quartz is provided between the surface wave plasma and an antenna, and a processing gas is supplied into the processing vessel from a sidewall of the processing vessel. Since, however, the processing gas is supplied from a portion other than the ceiling portion, it has been difficult to control a gas flow appropriately. Resultantly, it has been also difficult to control the plasma effectively.

In this regard, Patent Document 2 describes a technique of providing, under an antenna, a shower plate that has a multiple number of gas holes and is made of a dielectric material, and introducing a processing gas vertically downwards into the processing vessel through the shower plate. In this method, a gas flow in the vertical direction is formed within the processing vessel, so that the processing gas may be supplied uniformly and uniform plasma can be generated.

Patent Document 1: Japanese Patent Laid-open Publication No. 2003-188103

Patent Document 2: Japanese Patent Laid-open Publication No. 2005-196994

According to the present inventors, however, in the plasma processing apparatus having the antenna and the shower plate as described in Patent Document 2, for example, it is observed that a film is formed within the holes of the shower plate. If the film is formed within the holes, however, the holes may be blocked.

The reason for the film formation within the holes of the shower plate is because, due to surface wave plasma, an electron temperature at a region in the vicinity of the shower plate is higher than that at a region far from a surface of the shower plate. By way of example, a source gas such as a monosilane ($SiH_4$) gas is excessively decomposed in the vicinity of the shower plate. As a result, the decomposed source gas may be deposited to form a film in hole portions of the shower plate or may become the cause of dust through the gas phase reaction.

The present inventors believed that if the source gas supplied from the shower plate can reach the inside of the processing vessel without passing through the region having the high electron temperature in the vicinity of the shower plate, the film formation or the vapor phase epitaxy in the vicinity of the shower plate could be suppressed.

SUMMARY

In view of the foregoing, example embodiments provide a plasma processing apparatus, having a shower plate configured to introduce a gas into a processing vessel and configured to generate surface wave plasma by a microwave, capable of suppressing a film from being formed in a gas hole of the shower plate.

In one example embodiment, a plasma processing apparatus, including a processing vessel in which a plasma process is performed and a plasma generation antenna having a shower plate which supplies a first gas and a second gas into the processing vessel, performs the plasma process on a substrate with plasma generated by a surface wave formed on a surface of the shower plate through a supply of a microwave. Further, the shower plate has a multiple number of gas holes configured to supply the first gas into the processing vessel and a multiple number of supply nozzles configured to supply the second gas into the processing vessel, and the supply nozzles are protruded vertically downwards from a bottom surface of the shower plate and are provided at different positions from the gas holes.

According to this example embodiment, since the second gas is supplied into the processing vessel through the supply nozzles protruded vertically downwards from the bottom surface of the shower plate, the second gas does not pass through a region having a high electron temperature in the vicinity of the shower plate. Accordingly, even when a source gas is used as the second gas, it is possible to suppress the source gas from being excessively decomposed by the surface wave plasma. As a result, it is possible to reduce deposits that might be caused by occurrence of a reaction and a gas phase reaction in the gas holes of the shower plate.

The second gas may be more easily decomposed by the plasma than the first gas. In this case, the second gas may be a source gas, and the first gas may be a gas for generating the plasma.

A base member protruded downwards may be provided at the bottom surface of the shower plate and recess portions depressed upwards may be formed at the base member in a preset pattern. Further, the supply nozzles may be provided at the recess portions.

The gas holes and the supply nozzles may be arranged to be equi-spaced when viewed from a plane.

A distance from the bottom surface of the shower plate to a lower end of each supply nozzle may be equivalent to about 1/16 to about 3/16 of a wavelength of the supplied microwave.

The supply nozzles may be provided at a portion of the shower plate excluding a central portion thereof.

Flow rates of the first gas supplied from the gas holes may be different for each of the gas holes and/or flow rates of the second gas supplied from the supply nozzles may be different for each of the supply nozzles.

In another example embodiment, a shower plate supplies a first gas and a second gas into a processing vessel of a plasma processing apparatus in which a plasma process is performed. The shower plate includes a multiple number of gas holes configured to supply the first gas into the processing vessel and a multiple number of supply nozzles configured to supply the second gas into the processing vessel. Further, the supply nozzles are protruded vertically downwards from a bottom surface of the shower plate and are provided at different positions from the gas holes.

In accordance with the example embodiments, in the plasma processing apparatus that includes the shower plate configured to introduce a gas into the processing vessel and is configured to generate plasma by a microwave, it is possible to reduce deposits that might be caused by occurrence of a reaction and a gas phase reaction in the gas holes of the shower plate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
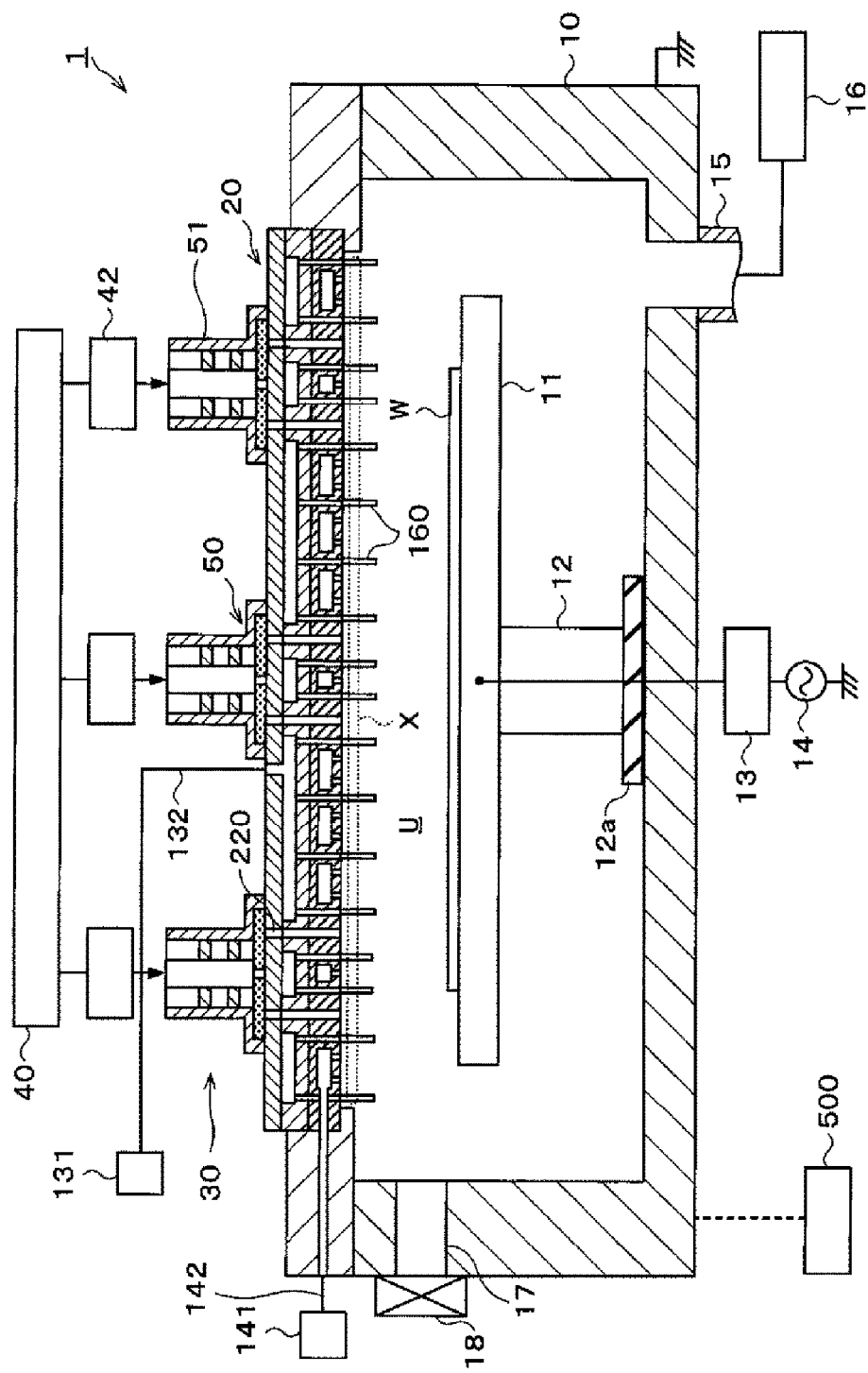
FIG. 1 is a longitudinal cross sectional view illustrating a schematic configuration of a plasma processing apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

First, an overall configuration of a plasma processing apparatus in accordance with an example embodiment will be explained with reference to FIG. 1. FIG. 1 is a longitudinal cross sectional view schematically illustrating the plasma processing apparatus 1.

In the present example embodiment, the plasma processing apparatus 1 is configured as, by way of example, a CVD apparatus that performs a film forming process as a plasma process on a semiconductor wafer W (hereinafter, simply referred to as a "wafer W"). The plasma processing apparatus 1 includes a processing vessel 10 configured to perform a plasma process on the wafer W in a hermetically sealed inside thereof. The processing vessel 10 is of a substantially cylindrical shape having a top opening and is made of a metal such as, but not limited to, aluminum. The processing vessel 10 is electrically grounded.

A susceptor 11 configured to mount the wafer W thereon is provided at a bottom portion of the processing vessel 10. The susceptor 11 is made of a metal such as, but not limited to, aluminum and is supported by a supporting member 12 which is provided at the bottom portion of the processing vessel 12 via an insulator 12a. In this configuration, the susceptor 11 is in an electrically floating state. The susceptor 11 and the supporting member 12 may be made of, but not limited to, aluminum having an alumite-treated (anodically oxidized) surface.

A high frequency bias power supply 14 is connected to the susceptor 11 via a matching device 13. The high frequency power supply 14 is configured to apply a high frequency bias power to the susceptor 11, and, thus, ions in plasma are attracted to the wafer W. Further, though not shown, the susceptor 11 may be equipped with an electrostatic chuck configured to attract and hold the wafer W electrostatically, a temperature control device, a gas flow path through which a heat transfer gas is supplied to a rear surface of the wafer W, an elevating pin configured to elevate the wafer W up and down when transferring the wafer W, etc.

A gas exhaust opening 15 is formed in the bottom portion of the processing vessel 10, and a gas exhaust device 16 including a vacuum pump is connected to the gas exhaust opening 15. If the gas exhaust device 16 is operated, the inside of the processing vessel 10 is evacuated and depressurized to a required vacuum level. Further, a loading/ unloading opening 17 is a formed in a sidewall of the processing vessel 10, and a gate valve 18 configured to open and close the loading/unloading opening 17 is provided at the loading/unloading opening 17. After opening the gate valve 18, the wafer W is loaded into or unloaded from the processing vessel 10.

Provided above the susceptor 11 is a plasma generation antenna 20 (hereinafter, simply referred to as an "antenna 20") configured to supply a microwave while supplying a gas into the processing vessel 10. The antenna 20 closes the top opening of the processing vessel 10. Accordingly, a plasma space U is formed between the susceptor 11 and the antenna 20. A microwave transmitting device 30 configured to transmit a microwave is connected to a top portion of the antenna 20. The microwave transmitting device 30 transmits a microwave outputted from a microwave output unit 40 to the antenna 20.

The plasma processing apparatus 1 further includes a controller 500 as illustrated in FIG. 1. The controller 500 is implemented by, e.g., a computer and includes a program storage unit (not shown). The program storage unit stores therein programs for controlling a processing of a wafer W in the plasma processing apparatus 1. The programs may be stored on a computer-readable storage medium such as, but not limited to, a hard disk (HD), a flexible disk (FD), a compact disk (CD), a magnet optical disk (MO), a memory card, etc. The programs may be read out from the storage medium and installed at the controller 500.

Figure 2:
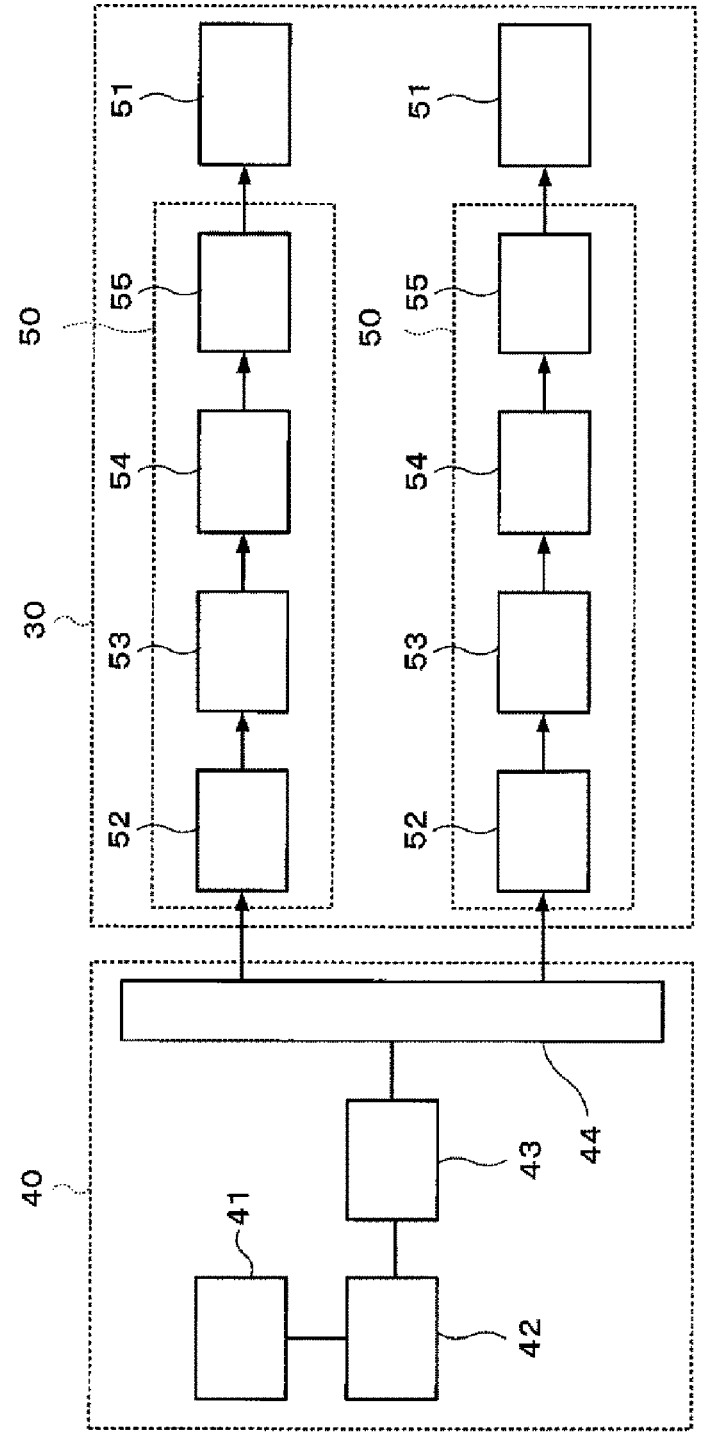
FIG. 2 is a diagram showing a configuration on a microwave output side.

Now, referring to FIG. 2, configurations of the microwave output unit 40 and the microwave transmitting device 30 will be explained.

The microwave output unit 40 includes a microwave power supply 41, a microwave oscillator 42, an amplifier 43 and a splitter 44 configured to split an amplified microwave in plural. The microwave power supply 41 is configured to supply a power to the microwave oscillator 42. The microwave oscillator 42 is configured to generate a microwave of a preset frequency of, e.g., about 860 MHz in PLL (Phase-Locked Loop). The amplifier 43 is configured to amplify the generated microwave. The splitter 44 is configured to split the microwave amplified by the amplifier 43 while performing an impedance matching between an input side thereof and an output side to suppress a loss of the microwave.

Figure 3:
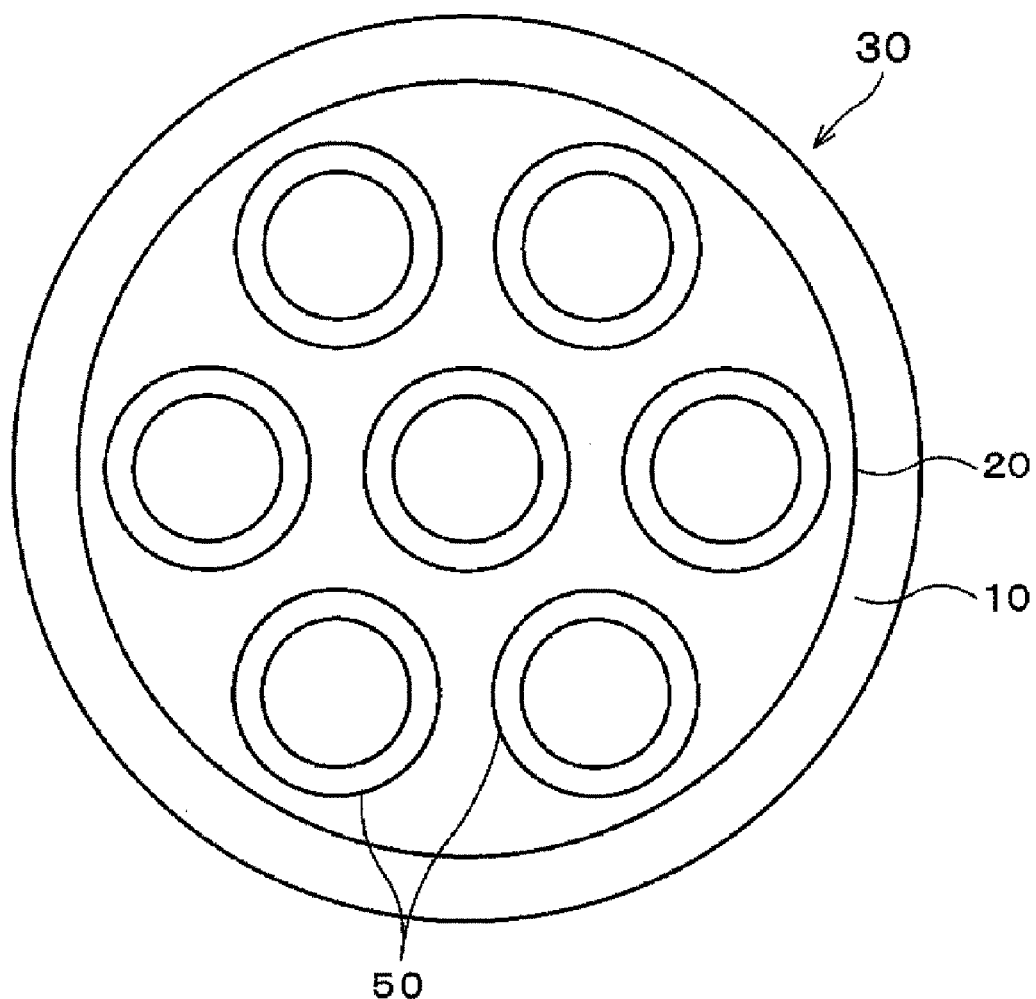
FIG. 3 is a plane view schematically illustrating a configuration of a microwave transmitting device.

The microwave transmitting device 30 includes a multiple number of antenna modules 50 configured to introduce the microwave split by the splitter 44 into the processing vessel; and microwave introducing devices 51. In FIG. 2, the microwave transmitting device 30 is illustrated to have two antenna modules 50 and two microwave introducing devices 51. However, in the present example embodiment, the microwave transmitting device 30 includes, as depicted in FIG. 3, for example, seven antenna modules 50 provided on top of the antenna 20. Among them, six antenna modules are concyclically arranged on a common circle, and the rest one antenna module 50 is arranged at a center thereof.

Each antenna module 50 includes a phase shifter 52, a variable gain amplifier 53, a main amplifier 54 and an isolator 55. The antenna module 50 is configured to transmit the microwave outputted from the microwave output unit 40 to the microwave introducing device 51.

The phase shifter 52 is configured to change a phase of the microwave. By controlling the phase shifter 52, a radiation characteristic of the microwave can be modulated. Accordingly, it is possible to vary a plasma distribution by controlling directivity. When such modulation of the radiation characteristic is not necessary, the phase shifter 52 may be omitted.

The variable gain amplifier 53 is configured to adjust a power level of the microwave inputted to the main amplifier 54 and, also, adjust plasma intensity. The main amplifier 54 is implemented by a solid state amplifier. The solid state amplifier may include an input matching circuit, a semiconductor amplifying device, an output matching circuit and a high-Q resonant circuit, though not illustrated.

The isolator 55 is configured to separate a reflected wave of the microwave returned back to the main amplifier 54 after reflected by the antenna 20. The isolator 55 includes a circulator and a dummy load (coaxial terminator). The circulator is configured to guide the reflected microwave from the antenna 20 to the dummy load, and the dummy load is configured to convert the reflected microwave, which is guided by the circulator, into heat.

Figure 4:
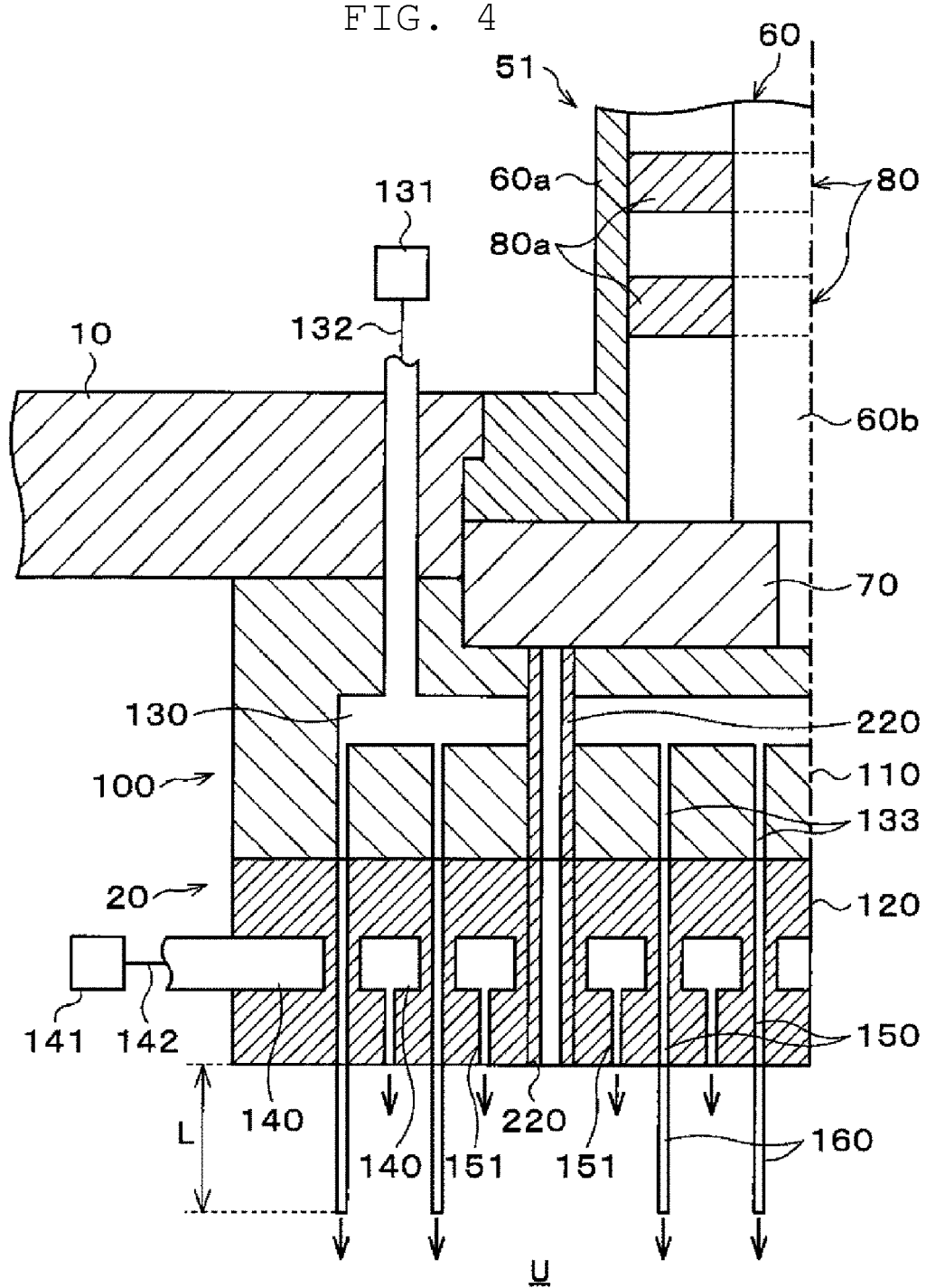
FIG. 4 is an enlarged longitudinal cross sectional view illustrating a schematic configuration in the vicinity of a microwave introducing device.

Now, configurations of the microwave introducing device 51 and the plasma generation antenna 20 will be elaborated with reference to FIG. 4. FIG. 4 is an enlarged longitudinal cross sectional view illustrating a configuration of, for example, the left half of the microwave introducing device 51 and the antenna 20 in accordance with the example embodiment.

The microwave introducing device 51 includes a coaxial waveguide 60 and a wavelength shortening plate 70. The coaxial waveguide 60 includes a cylindrical external conductor 60a and a rod-shaped internal conductor 60b provided in a center of the external conductor 60a. The antenna 20 is provided at a lower end of the coaxial waveguide 60 via the wavelength shortening plate 70. In the coaxial waveguide 60, the internal conductor 60b serves as a power supply side, and the external conductor 60a serves as a ground side. The coaxial waveguide 60 is equipped with a tuner 80. The tuner 80 includes, for example, two slugs 80a and is configured as a slug tuner. Each slug 80a is a plate-shaped body made of a dielectric material and is formed in a circular ring shape between the internal conductor 60b and the external conductor 60a. The tuner 80 moves the slugs 80a up and down by a non-illustrated driving device in response to an instruction from the controller 500 to be described later, so that an impedance of the coaxial waveguide 60 can be adjusted.

The wavelength shortening plate 70 is provided adjacent to a bottom surface of the coaxial waveguide 60. The wavelength shortening plate 70 is a dielectric member having a circulate plate shape. The wavelength shortening plate 70 transmits and guides the microwave propagated through the coaxial waveguide 60 to the antenna 20.

The antenna 20 has a shower plate 100. The shower plate 100 is provided adjacent to a bottom surface of the wavelength shortening plate 70. The shower plate 100 is of a substantially disk shape having a larger diameter than that of the wavelength shortening plate 70. The shower plate 100 is made of a conductor having a high electrical conductivity, such as, but not limited to, aluminum or copper. The shower plate 100 is exposed to the plasma space U in the processing vessel 10, and a surface wave is propagated on the exposed bottom surface of the shower plate 100. Hereinafter, the surface wave that is propagated in the exposed bottom surface will be referred to as a metal surface wave.

The shower plate 100 includes an upper plate 110 having a substantially circular plate shape and a lower plate 120 having a substantially circular plate shape that are stacked on top of each other. The upper plate 110 has therein a gas flow path 130 which is formed through a top surface of the upper plate 110 and through which a gas is flown in a diametrical direction of the upper plate 110. A second gas supply source 131 configured to supply a second gas is connected to the gas flow path 130 via a gas supply line 132. By way of non-limiting example, a monosilane gas ($SiH_4$) as a source gas is used as the second gas. A multiple number of gas holes 133 that is communicated with the gas flow path 130 and is extended vertically upwards, are formed over an entire bottom surface region of the upper plate 110 corresponding to the wafer W mounted on the susceptor 11. Further, the upper plate 110 also has a multiple number of slots 220 through which a microwave is propagated. The slots 220 are formed at different positions from the gas holes 133.

The lower plate 120 has a gas flow path 140 which is formed through a sidewall of the lower plate 120 and through which a gas is flown in a diametrical direction of the lower plate 120. A first gas supply source 141 configured to supply a first gas is connected to the gas flow path 140 via a gas supply line 142. By way of example, a gas for plasma generation, such as a nitrogen gas, an argon gas, a hydrogen gas, or a mixture thereof may be used as the first gas. Further, the gas flow path 140 are formed to be independent from the gas flow path 130 in order to suppress the gas flown in the gas flow path 140 from being mixed with the gas flown in the gas flow path 130.

Through holes 150 are vertically extended through the lower plate 120 at positions corresponding to the gas holes 133 of the upper plate 110. Further, as in the upper plate 110, slots 220 are formed through the lower plate 120 at positions corresponding to the slots 220 of the upper plate 110.

A multiple number of gas holes 151, that is communicated with the gas flow path 140 and is extended vertically upwards, are formed over an entire bottom surface region of the lower plate 120 corresponding to the wafer W mounted on the susceptor 11. Further, the gas holes 151 are arranged at positions different from the through holes 150 and the slots 220. The first gas supplied into the gas flow path 140 from the first gas supply source 141 is introduced into the plasma space U of the processing vessel 10 from the bottom surface of the lower plate 120 through the gas holes 151.

Supply nozzles 160, which are formed by thermally spraying an oxide film or silicon to aluminum or stainless steel, are connected to lower ends of the respective through holes 150. That is, the supply nozzles 160 are provided at positions on the bottom surface of the lower plate 120 corresponding to the through holes 150. Each supply nozzle 160 is vertically protruded downwards from the lower end of the through holes 150 by a preset length L, as depicted in FIG. 4, for example. With this configuration, the second gas supplied into the gas flow path 130 from the second gas supply source 131 is allowed to be introduced into the plasma space U of the processing vessel 10 through the supply nozzles 160 from positions which are lower by the preset length L than positions from which the first gas is introduced thereinto.

Surfaces of the shower plate 100 exposed to plasma, i.e., the bottom surface of the lower plate 120 and the surfaces of the supply nozzles 160 may be covered with a film (not shown) of, e.g., alumina ($Al_2O_3$) or yttria ($Y_2O_3$) by thermal spraying. Accordingly, conductor surfaces may be not exposed to the plasma space U.

The multiple number of slots 220 are formed at positions different from the gas flow paths 130 and 140, the gas holes 133 and 151, and the through holes 150, which serves as gas supply channels. Further, the slots 220 are formed in a direction perpendicular to the diametrical direction of the shower plate 100. One end of each slot 220 is adjacent to the wavelength shortening plate 70, and the other end thereof is opened to the inside of the processing vessel 10. A microwave is propagated through the coaxial waveguide 60, transmitted through the wavelength shortening plate 70, and then, radiated into the processing vessel 10 through the slots 220. The inside of the slots 220 may be filled with a dielectric material such as, but not limited to, quartz.

Figure 5:
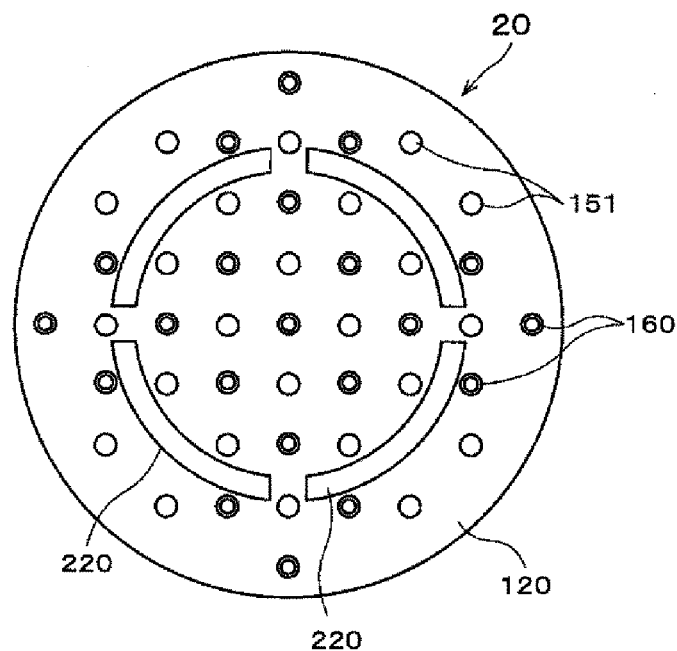
FIG. 5 is a bottom view of a shower plate.
Figure 6:
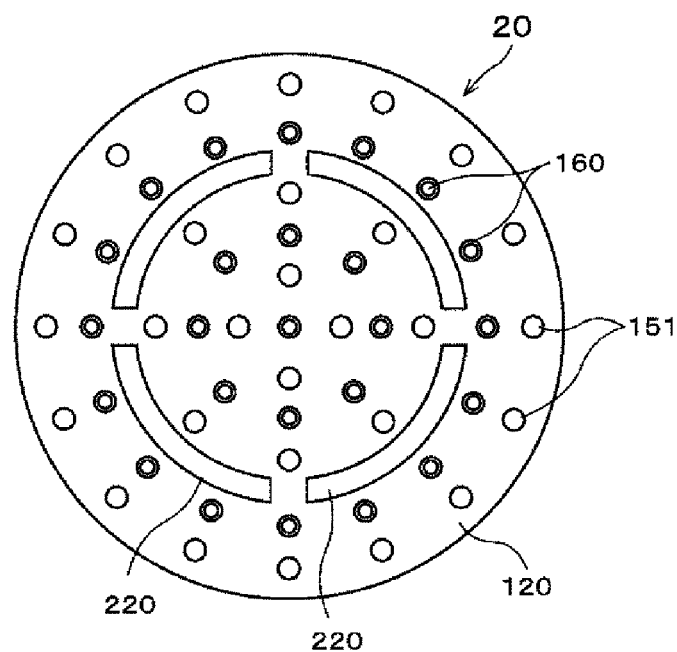
FIG. 6 is a bottom view of a shower plate in accordance with another example embodiment.

FIG. 5 is a bottom view illustrating a state in which the surface of the shower plate 100 exposed to the processing vessel 10, i.e., the lower plate 120 is seen from below. As shown in FIG. 5, the supply nozzles 160 and the gas holes 151 of the lower plate 120 are alternately arranged at the lower plate 120 in, e.g., a lattice-shaped pattern. In FIG. 5, in order to distinguish the supply nozzles 160 and the gas holes 151, a position corresponding to each supply nozzle 160 is indicated by double circles, and a position corresponding to each gas hole 151 is indicated by a single circle. In this way, by arranging the supply nozzles 160 and the gas holes 151 alternately, it is possible to supply, e.g., a nitrogen gas and a monosilane gas uniformly onto a top surface of the wafer W. The arrangement of the supply nozzles 160 and the gas holes 151 is not limited to the present example and may be modified in various ways as long as the supply nozzles 160 and the gas holes 151 of the lower plate 120 are arranged in a substantially uniform manner to uniformly supply the gases supplied from the supply nozzles 160 and the gas holes 151 onto the top surface of the wafer W. Here, the uniform arrangement of the supply nozzles 160 and the gas holes 151 of the lower plate 120 does not imply that a distance between each gas hole 151 and each supply nozzle 160 is the same but implies that the number of supply nozzles 160 is substantially same as that of gas holes 151 and the supply nozzles 160 and the gas holes 151 are arranged alternately, as illustrated in FIG. 5. As another example besides the one depicted in FIG. 5, the supply nozzles 160 and the gas holes 151 may be alternately arranged concentrically, as illustrated in FIG. 6.

The slots 220 are formed in a substantially annular shape. The supply nozzles 160 and the through holes 150 are formed in a region at inner circumference sides of the slots 220 and a region at outer circumference sides thereof. The slots 220 are not formed in a complete ring shape and may be divided into, e.g., four separate fan-shaped sectors. The gas flow path 140 is formed in gaps between the slots 220 not to communicate with the slots 220 and supplies the gas into the gas holes 151 formed inside the slots 220.

The slots 220 are formed to be axially symmetrical with respect to a central axis of the antenna 20. Accordingly, it is possible to radiate a microwave from the slots 220 into the processing vessel 10 more uniformly.

A diameter of each gas hole 151 and each supply nozzle 160 is set to be a size that allows the microwave radiated into the processing vessel 10 not to enter the gas hole 151 and the supply nozzle 160. In the present example embodiment, the diameter is set to be, e.g., about 0.6 mm. Further, the slots 220 are completely separated from the gas holes 133 and 151 and the through holes 150. Accordingly, it is possible to suppress an abnormal electric discharge in the gas holes 133 and 151 and in the through holes 150.

Further, contact surfaces between the wavelength shortening plate 70 and the upper plate 110 and between the upper plate 110 and the lower plate 120 are sealed by non-illustrated O-rings, respectively. Accordingly, the inside of the processing vessel 10 and the inside of the slots 220 can be set in a vacuum state, and the first gas and the second gas can be suppressed from being mixed within the shower plate 100.

The plasma processing apparatus 1 in accordance with the present example embodiment is configured as described above. Now, in describing an operation of the plasma processing apparatus 1, principles of the present disclosure will be explained first.

A binding energy of, e.g., a nitrogen gas used as the plasma generation gas in a microwave plasma process is about 9.91 eV. Meanwhile, in order to decompose, e.g., a monosilane gas ($SiH_4$), which is used as the source gas when forming a film on the wafer W by the plasma process, into $SiH_3$, an energy of about 8.75 eV is required. An output of a microwave supplied to the antenna 20 in the microwave plasma process is determined based on an energy required for generating radicals or precursors which are used in forming the film. Typically, in a microwave plasma process using a metal surface wave (particularly, in a surface wave plasma process using an evanescent wave), an electron temperature at a region in the vicinity of a bottom surface of the antenna 20 as shown in FIG. 1, for example, in a region X within about 5 mm from the bottom surface of the antenna 20 is higher than an electron temperature in a region under the region X.

Accordingly, as in the conventional case, if the nitrogen gas as the plasma generation gas and the monosilane gas as the source gas are supplied from the same plane on the surface of the shower plate, the nitrogen gas is decomposed into nitrogen radicals in the region X. However, in the region under the region X, since the electron temperature is low and energy is not enough, the nitrogen gas is not decomposed. Meanwhile, the monosilane gas is decomposed into $SiH_3$ even the region under the region X and is more actively decomposed in the region X where the electron temperature is high. Accordingly, $SiH_3$ may be generated excessively in the region X, so that a silicon film may be formed and deposited in the gas holes of the shower plate.

In order to reduce deposits that might be caused by occurrence of a reaction and a gas phase reaction, the output of the microwave and the electron temperature in the region X need to be reduced. However, as mentioned above, since a preset level of electron temperature is required in the region X in order to decompose the plasma generation gas, there has been a limit in reducing the output of the microwave.

In this regard, in order to suppress unnecessary deposits that might be caused by occurrence of the reaction and the gas phase reaction, the present inventors have investigated a method of introducing the source gas from the shower plate into the processing vessel 10 without passing through the region X having the high electron temperature. If the source gas is supplied into the processing vessel 10 from the sidewall of the processing vessel 10 as in the conventional case, it is difficult to control the gas flow within the processing vessel 10. Thus, uniform plasma may not be generated. That is, it is required to maintain a vertically descending gas flow toward the wafer W from the shower plate 100. The present inventors have found out that it is possible to introduce the source gas into the processing vessel 10 without passing through the region X if the gas flow paths 130 and 140 are formed separately to allow the plasma generation gas and the source gas not to be mixed with each other within the shower plate 100 and the nozzles having the length L longer than that of the region X are connected to the flow path for the source gas. In such a case, since it is possible to suppress the source gas from being excessively decomposed in the region X, generation of precursors from the source gas can also be suppressed, so that the gas holes can be suppressed from being blocked. This is the principle of the present disclosure, i.e., the reason why the shower plate 100 is divided into the upper plate 110 and the lower plate 120 and the supply nozzles 160 are provided at the lower plate 120.

In FIG. 4, the second gas supply source 131 is connected to the gas flow path 130 of the upper plate 110, and the through holes 150 and the supply nozzles 160 are formed at the lower plate 120. However, the configuration of the shower plate 100 may not be limited thereto. Especially, it is possible to select either one of the gas flow path 130 of the upper plate 110 and the gas flow path 140 of the lower plate 120 as a flow path to which the second gas supply source 131 is connected. By way of example, if the second gas supply source 131 is connected to the gas flow path 140 of the lower plate 120, the supply nozzle 160 may be connected to the gas holes 151 instead of being connected to the through holes 150. In such a configuration, the plasma generation gas as the first gas is directly supplied into the processing vessel 10 through the through holes 150, whereas the source gas as the second gas is directly supplied into the processing vessel 10 through the supply nozzles 160 from the positions lower than the bottom surface of the lower plate 120 by the preset length L.

Further, since a temperature in the vicinity of the bottom surface of the lower plate 120 is high due to the surface wave plasma, a temperature of the gas flowing in the gas flow path 140 may be increased due to heat of the plasma and the internal energy thereof may be also increased to be easily decomposable by the surface wave plasma. Thus, if a gas which is difficult to be decomposed, i.e., the plasma generation gas in this case is flown in the gas flow path 140, it may be possible to accelerate the decomposition of the gas by the surface wave plasma. Therefore, it is desirable to connect the second gas supply source 131 configured to supply the source gas to the gas flow path 130 of the upper plate 110 and connect the first gas supply source 141 configured to supply the plasma generation gas to the gas flow path 140 of the lower plate 120.

Meanwhile, by providing the supply nozzles 160, which are protruding members, at the lower plate 120, the surface wave is also propagated to the supply nozzles 160, to generate a resonance, so that uniform plasma may not be generated in the plasma space U. For this reason, the structure such as the supply nozzles 160 has not been employed conventionally. However, by setting the length L of the supply nozzle 160, i.e., a distance from the bottom surface of the lower plate 120 to a lower end of the supply nozzle 160 to be equivalent to about 1/16 to about 3/16, more desirably, about 1/8 of a wavelength of a microwave introduced into the processing vessel 10, resonance of the surface wave at the supply nozzle 160 can be suppressed, and it is possible to generate plasma stably within the processing vessel 10. Further, since the region X in which electron temperature is high due to the surface wave has a thickness of about 5 mm from the bottom surface of the shower plate 100, the lower end of the supply nozzle 160 is located sufficiently below the region X if the length L of the supply nozzle 160 is set to be, e.g., about 1/16 to about 3/16 of the wavelength of the microwave. In the present example embodiment, since a microwave of, e.g., about 860 MHz having a wavelength of, e.g., about 348.6 mm is used, the length L of the supply nozzle 160 may be set to be, e.g., about 43.6 mm, in the range from, e.g., about 21.8 mm to about 65.4 mm.

The plasma processing apparatus 1 in accordance with the present example embodiment has a structure based on the above principles. Now, a process performed in the plasma processing apparatus 1 will be described for an example case of forming a silicon nitride film on a wafer W.

First, a wafer W is loaded into the processing vessel 10 and mounted on the susceptor 11. Then, a mixture gas of a nitrogen gas, an argon gas and a hydrogen gas is introduced from the first gas supply source 141 into the processing vessel 10 via the lower plate 120 of the shower plate 100. Then, a microwave is outputted from the microwave output unit 40 and introduced into the processing vessel 10 through the microwave transmitting device 30, the wavelength shortening plate 70 and the slots 220. As a result, surface wave plasma is generated by a metal surface wave generated in a surface of the antenna 20, and nitrogen radicals are generated. Further, a monosilane gas as a source gas is introduced into the processing vessel 10 from the second gas supply source 131 via the supply nozzles 160.

The monosilane gas introduced into the processing vessel 10 is excited by the plasma and decomposed into $SiH_3$. At this time, since the monosilane gas is introduced into the plasma space U within the processing vessel 10 without passing through the region X right under the bottom surface of the antenna 20 where an electron temperature is high, the monosilane gas may not be decomposed excessively. As a result, occurrence of a reaction and a gas phase reaction by the excessive $SiH_3$ can be suppressed.

The nitrogen radicals and the $SiH_3$ may reach a surface of the wafer W by being carried on a vertically descending gas flow toward the wafer W and is deposited on a top surface of the wafer W as silicon nitride. As a result, a silicon nitride film is formed on the top surface of the wafer W.

In accordance with the above-described example embodiment, since the source gas, e.g., the monosilane gas is supplied into the processing vessel 10 through the supply nozzles 160 protruded vertically downwards from the bottom surface of the lower plate 120 of the shower plate 100 by the preset length L, the monosilane gas does not pass through the region X having the high electron temperature in the vicinity of the shower plate 100. Accordingly, excessive decomposition of the monosilane gas by the surface wave plasma can be avoided. As a result, when performing a plasma process on the wafer W by using the shower plate 100, it is possible to suppress a silicon film from being formed in the gas holes of the shower plate 100.

Further, since the supply nozzles 160 and the gas holes 151 are uniformly arranged, it is possible to uniform, e.g., a density of the nitrogen radicals and a density of $SiH_3$ on the surface of the wafer W. As a consequence, it is possible to deposit the silicon nitride film on the surface of the wafer W in a uniform thickness.

Moreover, since the length of the supply nozzle 160 is set to be, e.g., about ⅛ of the wavelength of the microwave outputted from the microwave output unit 40, it is possible to remove resonance condition of the microwave at the supply nozzles 160 protruded toward the plasma space U. As a consequence, the supply nozzles 160 can be suppressed from serving as an antenna and hampering generation of plasma. Thus, in accordance with the plasma processing apparatus 1 of the present example embodiment, it is possible to perform a stable plasma process. Further, with this configuration, it is possible to actively control the formation of the silicon nitride film on the surface of the wafer W by adjusting a supply amount (generation amount) of the nitrogen radicals.

Figure 7:
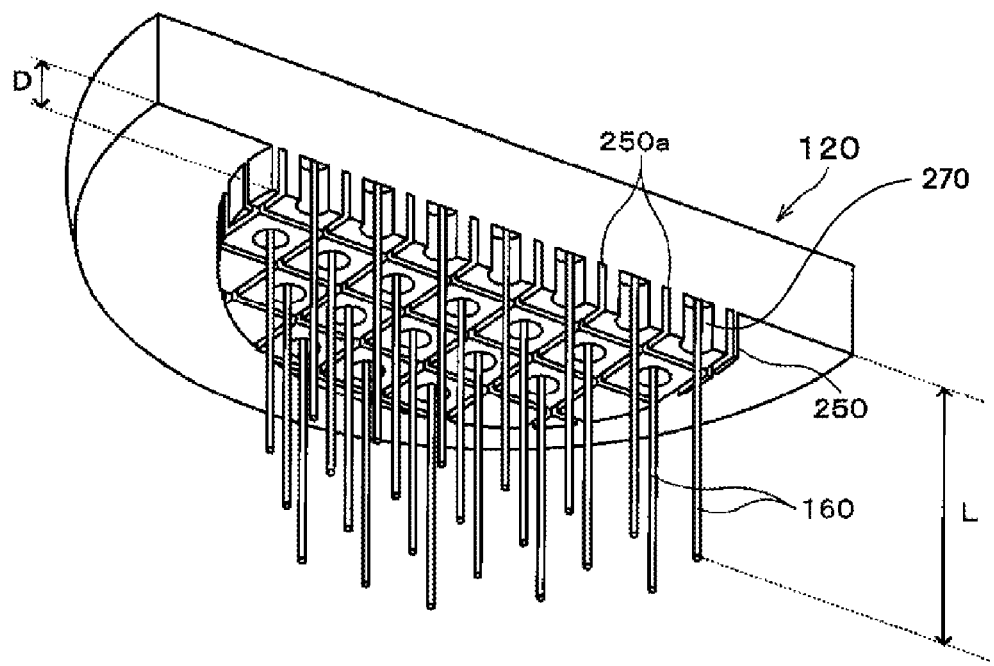
FIG. 7 is a perspective view illustrating an example configuration of a lower plate having a base member.

In the above-described example embodiment, the lower plate 120 is formed in the circular plate shape. Here, it may be also possible to provide a base member 250 at a region on the bottom surface of the lower plate 120 where the supply nozzles 160 are provided. The base member 250 is protruded downwards by a preset length D. In this case, the base member 250 is provided not to be contacted with the supply nozzles 160, as illustrated in FIG. 7, for example. That is, portions of the base member 250 corresponding to the supply nozzles 160 are recessed upward to form recess portions 270. Further, although the gas holes 151 are not shown in FIG. 7 for the simplicity of illustration, the gas holes 151 are formed in a bottom surface of the base member 250. With this configuration, a part of the microwave radiated from the slots 220 (quartz ring) may be reflected to weaken the microwave propagated to the supply nozzles 160. Meanwhile, although it is possible to weaken the microwave propagated to the supply nozzles 160 with this configuration, generation of radicals from a plasma generation gas such as a nitrogen gas or an argon gas supplied from positions having a same height as base ends of the supply nozzles 160, i.e., from the bottom surface of the base member 250 may be also weakened. By way of example, to avoid this problem, grooves 250a as depicted in FIG. 7 may be formed on the bottom surface of the base member 250. By forming the grooves 250a, the plasma generation gas such as the nitrogen gas or the argon gas is heated in the grooves 250a, so that the generation of radicals thereof can be accelerated. As an example shape of the grooves 250a, the grooves 250a may be formed in, e.g., a lattice-shaped pattern surrounding the respective supply nozzles 160, as depicted in FIG. 7.

Figure 8:
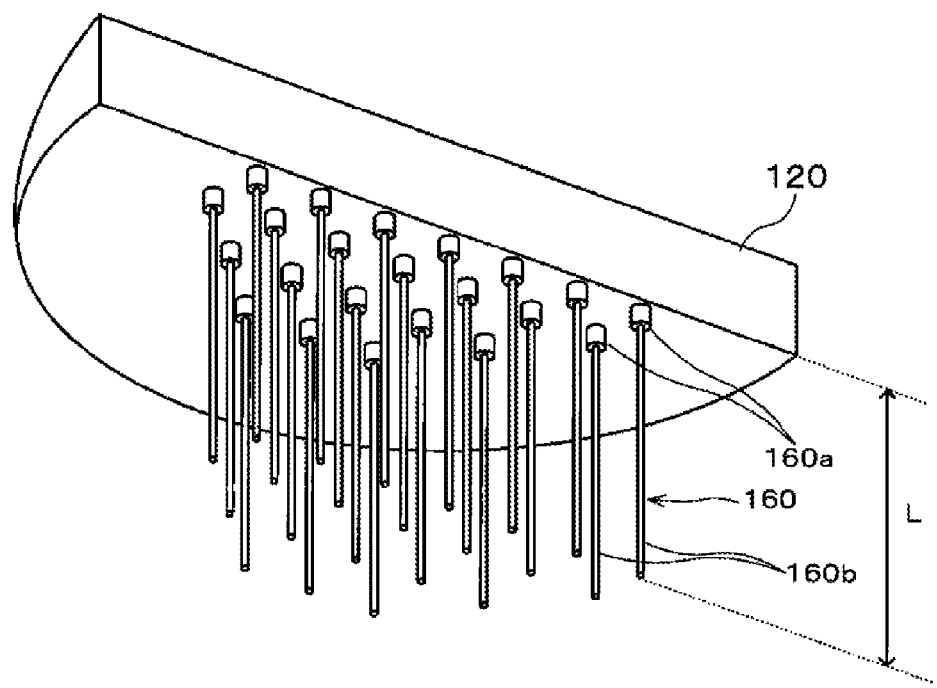
FIG. 8 is a perspective view illustrating an example configuration of a lower plate having a base member in accordance with another example embodiment.

In addition, as depicted in FIG. 8, an outer diameter of each supply nozzle 160 may have two or more levels in a lengthwise direction of the supply nozzle 160. To elaborate, as shown in FIG. 8, each supply nozzle 160 has a large-diameter portion 160a and a leading end portion 160b. Here, the large-diameter portion 160a has a diameter larger than the supply nozzle 160 shown in FIG. 7, and also has a preset length from the base end portion of the supply nozzle 160, i.e., a preset length from an end portion of the supply nozzle 160 at the side of the lower plate 120. Further, the leading end portion 160b is extended from the large-diameter portion 160a to a leading end of the supply nozzle 160, and has a diameter smaller than that of the large-diameter portion 160a. Accordingly, the microwave may be reflected on a corner portion of the supply nozzle 160 formed in a step shape as the diameter of the supply nozzle 160 is changed at a boundary between the large-diameter portion 160a and the leading end portion 160b. As a result, the microwave propagated to the supply nozzle 160 may be weakened greatly.

Figure 9:
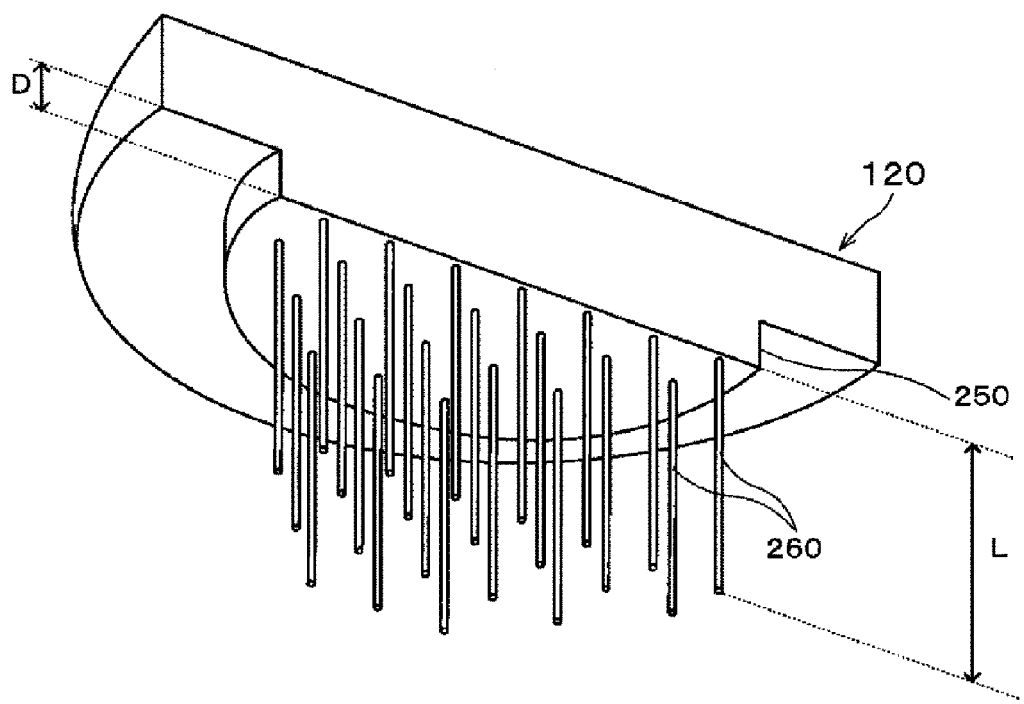
FIG. 9 is a perspective view illustrating an example configuration of a lower plate having a base member in accordance with still another example embodiment.

Further, the grooves 250a may not necessarily be formed at the base member 250. Besides, although the base member 250 is formed not to be contacted with the supply nozzles 160 in the example shown in FIG. 7, it may be also possible to directly provide the supply nozzles 260 on a bottom end of the base member 250, as depicted in FIG. 9. In such a case, the length of each supply nozzle 260 is the same as the length L of each supply nozzle 160 in FIG. 7. That is, the length from the bottom end of the base member 250 to a leading end of the supply nozzle 260 is set to be L regardless of presence or absence of the base member 250 or arrangement of the supply nozzles 160 (260). With this configuration where the supply nozzles 260 are directly provided at the base member 250, it is also possible to greatly weaken the microwave propagated to the supply nozzles 260. Further, the present inventors have observed that even in case that the grooves 250a are not formed at the base member 250, it is possible to suppress radical generation from the plasma generation gas such as the nitrogen gas or the argon gas from being weakened at the base end of the supply nozzles 260. Further, in FIG. 8 and FIG. 9, the gas holes 151 are not depicted for the simplicity of illustration. Further, in the configuration of FIG. 8, it may be possible to form the same grooves 250a as those shown in FIG. 7. In such a case, it is also possible to accelerate radical generation from the plasma generation gas such as the nitrogen gas or the argon gas due to the effect of the grooves 250a.

Further, in general, if a frequency of a power supplied to the antenna increases, a high frequency current oriented toward a center side from an edge side flows on a surface of the antenna facing plasma due to a surface effect. As a result, on the bottom surface of the antenna, there is generated an electric field intensity distribution in which electric field intensity is higher at a central portion surrounded by the slots 220 and gradually decreases toward an edge portion. For this reason, the present inventors have also observed that, in the antenna 20 in accordance with the present example embodiment as well, electric field intensity is increased in the vicinity of supply nozzles 160 located at a central portion surrounded by the slots 220. Through researches, the present inventors found out that by removing the supply nozzles 160 located at the central portion surrounded by the slots 220, it is possible to suppress an increase of the electric field intensity in the vicinity of the supply nozzles 160 at the central portion. Thus, the supply nozzles 160 may not be provided at the central region of the lower plate 120 surrounded by the slots 220. Here, the central portion surrounded by the slots 220 may not imply a single point in a region surrounded by the slots but may implies a region within, e.g., about 40 mm from a center of the region surrounded by the slots 220.

In the above-described example embodiment, the second gas supply source 131 is connected to the gas flow path 130 of the upper plate 110 via the single gas supply line 132, and the first gas supply source 141 is connected to the gas flow path 140 of the lower plate 120 via the single supply line 142. However, by way of example, each of the gas flow path 130 and the gas flow path 140 may include separate annular flow paths that are arranged concentrically, and a multiple number of supply lines 132 and a multiple number of supply lines 142 may be formed at the gas flow path 130 and the gas flow path 140, respectively. With this configuration, it is possible to control a flow rate of a gas supplied into each of the annular flow paths. Thus, since it is possible to control a the supply amount of the gas for each region of the lower plate 120, a more uniform plasma process can be performed on the wafer W by controlling the supply amount of the source gas or the plasma generation gas based on, for example, the electric field intensity distribution.

Especially, when supplying a monosilane gas into the processing vessel 10 as the source gas by using the conventional shower plate without the supply nozzles 160, the source gas may be excessively decomposed on a bottom surface of the shower plate 100, so that it may be difficult to control a generation amount of $SiH_3$. However, in the present example embodiment, since excessive generation of $SiH_3$ can be suppressed by supplying the monosilane gas through the supply nozzles 160, it may be possible to adjust a generation amount of $SiH_3$ by controlling a supply amount of the monosilane gas. In such a case, by controlling the supply amount of the gas for each region of the lower plate 120 through the gas supply lines 132 and the gas supply lines 142, it is possible to adjust generation amounts of nitrogen radicals and $SiH_3$ more precisely. Therefore, a more uniform plasma process can be performed on the wafer W.

Further, in the above-described example embodiment, the shower plate 100 includes the upper plate 110 and the lower plate 120. However, the structure of the shower plate 100 may not be particularly limited thereto but modified in various ways as long as the gas flow path 130 for the second gas and the gas flow path 140 for the first gas are independently formed in the shower plate 100 and these gases are not mixed within the shower plate 100.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A plasma processing apparatus including a processing vessel in which a plasma process is performed and a plasma generation antenna having a shower plate which supplies a first gas and a second gas into the processing vessel, the plasma processing apparatus performing the plasma process on a substrate with plasma generated by a surface wave formed on a surface of the shower plate through a supply of a microwave,
wherein the shower plate has a plurality of gas holes configured to supply the first gas into the processing vessel and a plurality of supply nozzles configured to supply the second gas into the processing vessel,
the supply nozzles are protruded vertically downwards from a bottom surface of the shower plate and are provided at different positions from the gas holes,
the supply nozzles are configured to pass through a region having an electron temperature higher in the vicinity of the shower plate than in any other region under the vicinity of the shower plate, and
a distance from the bottom surface of the shower plate to a lower end of each supply nozzle is equivalent to about $\frac{1}{16}$ to about $\frac{3}{16}$ of a wavelength of the supplied microwave.

2. The plasma processing apparatus of claim 1,
wherein the second gas is more easily decomposed by the plasma than the first gas.

3. The plasma processing apparatus of claim 2,
wherein the second gas is a source gas, and the first gas is a gas for generating the plasma.

4. The plasma processing apparatus of claim 1,
wherein a base member protruded downwards is provided at the bottom surface of the shower plate,
recess portions depressed upwards are formed at the base member in a preset pattern, and
the supply nozzles are provided at the recess portions.

5. The plasma processing apparatus of claim 1,
wherein the gas holes and the supply nozzles are arranged to be equi-spaced when viewed from a plane.

6. The plasma processing apparatus of claim 1,
wherein the supply nozzles are provided at a portion of the shower plate excluding a central portion thereof.

7. The plasma processing apparatus of claim 1,
wherein flow rates of the first gas supplied from the gas holes are different for each of the gas holes and/or flow rates of the second gas supplied from the supply nozzles are different for each of the supply nozzles.

8. A shower plate that supplies a first gas and a second gas into a processing vessel of a plasma processing apparatus in which a plasma process is performed, the plasma process being performed on a substrate with plasma generated by a surface wave formed on a surface of the shower plate through a supply of a microwave, the shower plate comprising:

a plurality of gas holes configured to supply the first gas into the processing vessel and a plurality of supply nozzles configured to supply the second gas into the processing vessel, wherein the supply nozzles are protruded vertically downwards from a bottom surface of the shower plate and are provided at different positions from the gas holes, the supply nozzles are configured to pass through a region having an electron temperature higher in the vicinity of the shower plate than in any other region under the vicinity of the shower plate, and a distance from the bottom surface of the shower plate to a lower end of each supply nozzle is equivalent to about $1/16$ to about $3/16$ of a wavelength of the supplied microwave.

* * * * *